(12) United States Patent
Pharn et al.

(10) Patent No.: US 7,208,776 B2
(45) Date of Patent: Apr. 24, 2007

(54) FUSE CORNER PAD FOR AN INTEGRATED CIRCUIT

(75) Inventors: Art Pharn, Huntington Beach, CA (US); James Seymour, Laguna Hills, CA (US); Jennifer Chiao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 5 days.

(21) Appl. No.: 10/767,739

(22) Filed: Jan. 30, 2004

(65) Prior Publication Data

US 2005/0167825 A1  Aug. 4, 2005

(51) Int. Cl.
*H01L 29/74* (2006.01)
*H01L 31/111* (2006.01)

(52) U.S. Cl. ..................... 257/173; 257/530

(58) Field of Classification Search ............... 257/48, 257/50, 173, 529, 530, 665, 910
See application file for complete search history.

(56) References Cited

U.S. PATENT DOCUMENTS 5,309,394 A    5/1994  Wuertz et al.
6,025,730 A    2/2000  Akram et al.
6,054,334 A *  4/2000  Ma ............................ 438/14
6,243,283 B1   6/2001  Bertin et al.
6,348,742 B1*  2/2002  MacPherson ............... 257/786
6,489,640 B1   12/2002 Smith
6,613,612 B2   9/2003  Park

* cited by examiner

*Primary Examiner*—Hoai Pham
(74) *Attorney, Agent, or Firm*—Sterne, Kessler, Goldstein & Fox, P.L.L.C.

(57) ABSTRACT

A fuse corner pad is part of an integrated circuit that includes a built-in fuse contact and a plurality of auxiliary pads. The fuse contact is a conductive metallic or metalloid structure that is connected to a fuse element. The fuse contact and fuse element are used inside of the fuse corner pad for programmability (e.g., for security) and/or adjustment (e.g., trimming) of analog and/or digital signals. The fuse contact and fuse element are not required to be bonded to an external electrical connection (such as, a pin or ball). The auxiliary pads provide a variety of functional or non-functional applications, such as testing, probing, programming, and/or circuit adjustment.

13 Claims, 4 Drawing Sheets

FUSE CORNER PAD FOR AN INTEGRATED CIRCUIT

BACKGROUND OF THE INVENTION

1. Field of the Invention

The present invention generally relates to integrated circuits, and more particularly to a semiconductor having a fuse formed within an integrated circuit.

2. Related Art

To fabricate a semiconductor package, a metallization layer is typically deposited onto a substrate to develop circuitry for a wire bond area on one side and circuitry for a ball attach area on the opposite side of the substrate. Solder masks can be applied to provide mechanical and electrical support, and a via hole or through hole connects the wire bond circuitry to the ball attach circuitry. Semiconductor packages serve as a mounting device for semiconductors. A semiconductor may be referred to as a die, an integrated circuit, or a chip.

Semiconductor packages are actually interposers, which lie between a semiconductor and a larger printed circuit board. The function of the interposers is to serve as a "fan out" for the very high-density electrical inputs and outputs from the semiconductor. The interposer transitions the very high density electrical output from the semiconductor into a less dense output that is suitable for mounting an assembled packaging substrate (i.e., semiconductor package and semiconductor die) to the printed circuit board.

Fuses can be embedded within the logic circuit of a semiconductor to perform a variety of roles. In a high-density, or otherwise highly integrated circuit, several fuses are required to trim, adjust, or calibrate analog circuits in a semiconductor. An example of a highly integrated circuit is 24-port Ethernet device. For a 24-port Ethernet device, twelve fuses are required to trim all twenty-four ports. For a pad-limited design where the number of pads dictates the area of a die, these fuse pads increase the required surface area for the overall chip size.

What is needed is a method for fabricating semiconductors that include one or more fuses without having to grow the overall chip size.

SUMMARY OF THE INVENTION

A fuse corner pad includes an embedded fuse that can be probed but does not require bonding. A conventional corner pad is useless because it cannot be bonded to a pin or ball. Bonding to a corner pad is generally unacceptable because of mechanical stress on the corner of a die. According to the present invention, the dice on the fuse corner pad do not need to be bonded out to a pin or ball. Therefore, the fuse corner pad can be located at the corner of a chip. The fuse corner pad can be probed, programmed, or blown at the wafer level before the die is cut and put in a package. In an embodiment, four fuse corner pads are developed on a chip, with each fuse corner pad being located in a respective corner of the chip.

The fuse corner pad includes a built-in fuse contact and a plurality of auxiliary pads. The fuse contact is a conductive metallic or metalloid structure that is connected to a fuse element. In an embodiment, the fuse contact is located along the outside perimeter of one side of the fuse corner pad. In an embodiment, the fuse element is located near the center of the fuse corner pad.

The fuse contact and fuse element are used inside of the fuse corner pad for programmability (e.g., for security) and/or adjustment (e.g., trimming) of analog and/or digital signals. The fuse contact and fuse element are not bonded to an external electrical connection, such as a pin and/or ball on the fuse corner pad.

The auxiliary pads provide a variety of functional or non-functional applications, such as testing, probing, programming, and/or circuit adjustment.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the pertinent art(s) to make and use the invention. In the drawings, like reference numbers indicate identical or functionally similar elements. Additionally, the leftmost digit(s) of a reference number identifies the drawing in which the reference number first appears.

DETAILED DESCRIPTION OF THE INVENTION

Figure 1:
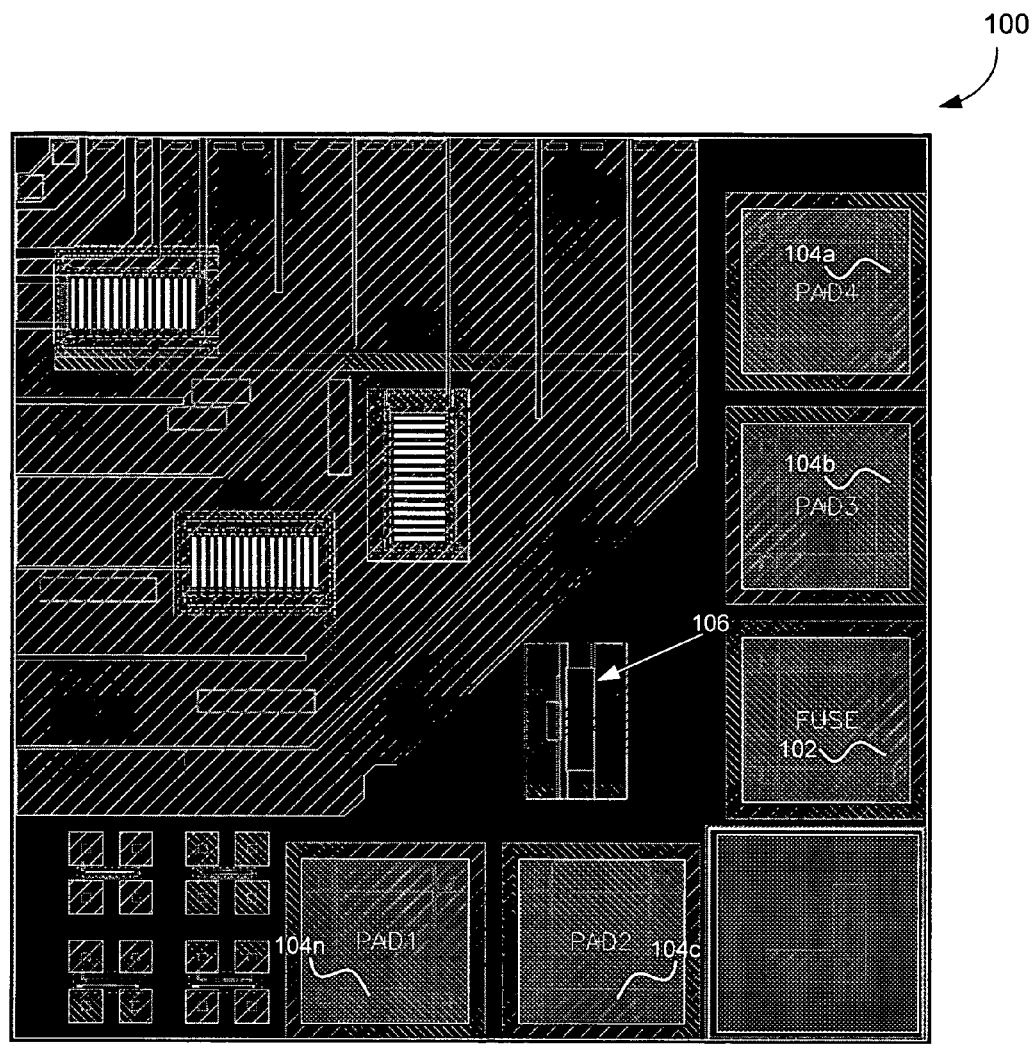
FIG. 1 illustrates a fuse corner pad according to an embodiment of the present invention.

FIG. 1 illustrates a fuse corner pad 100 according to an embodiment of the present invention. Fuse corner pad 100 is part of an integrated circuit or semiconductor chip that can be coupled to a larger integrated circuit, semiconductor package, substrate, printed circuit board, or the like. In embodiments, fuse corner pad 100 is implemented in the corner of a single CMOS substrate.

Fuse corner pad 100 includes a built-in fuse contact 102 and a plurality of auxiliary pads 104a–104n. Fuse contact 102 is a conductive metallic or metalloid structure that is attached to or embedded within fuse corner pad 100. Fuse contact 102 is electrically connected to a fuse element 106. Fuse contact 102 and fuse element 106 are not bonded to an external electrical connection (such as, a pin or ball) on fuse corner pad 100. As shown, fuse contact 102 is located near an edge of the outside perimeter of corner pad 100, and fuse element 106 is located near the center of fuse corner pad 100. However, in other embodiments, fuse contact 102 and/or fuse element 106 can be positioned in other areas of fuse corner pad 100 as long as fuse corner pad 100 is configured to efficiently provide the electrical interconnection between the two components. For example, fuse contact 102 can be located near an edge of the inside perimeter of corner pad 100.

In another embodiment, fuse element 106 is located at a position outside of fuse corner pad 100, but embedded within the integrated circuit for which fuse corner pad 100 is a part. Therefore, fuse element 106 need not be a direct component of fuse corner pad 100, itself, as long as a electrical connection is provided between fuse element 106 and fuse contact 102.

Auxiliary pads 104a–104n can be functional or non-functional areas of fuse corner pad 100, depending on the system requirements as determined by designer. In an embodiment, fuse corner pad 100 does not include auxiliary pads 104a–104n. In another embodiment of the present invention, one or more of auxiliary pads 104a–104n are additional fuse contact(s) 102, each being electrically connected to a respective fuse element 106. In another embodiment, auxiliary pads 104a–104n are used for other purposes, including, but not limited to, circuit testing, probing, and identification.

It should be understood, however, that the present invention is not limited to the layout shown in FIG. 1. In other embodiments of the present invention, the total quantity of fuse contacts 102 and/or fuse elements 106 can also be increased as determined by the system designer. Although fuse corner pad 100 includes only four auxiliary pads 104a–104n in FIG. 1, the total quantity of auxiliary pads 104a–104n can also be increased or decreased as determined by the system designer.

Figure 2:
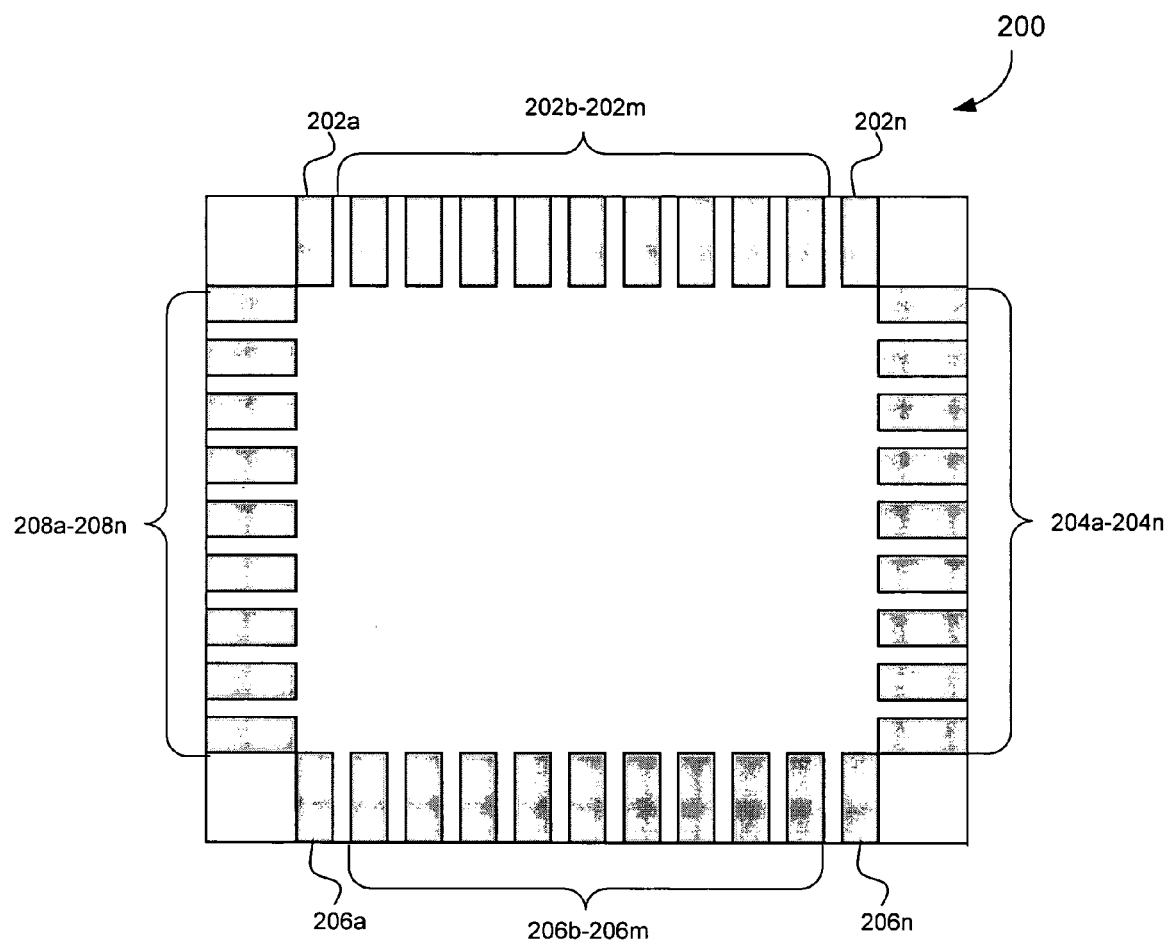
FIG. 2 illustrates a semiconductor die.

The layout of fuse corner pad 100 is configured to minimize the substrate area of the integrated circuit that includes fuse corner pad 100. This can be explained with reference to FIG. 2 and FIG. 3. FIG. 2 illustrates a square die 200 that includes a plurality of pads located on the outside perimeter. The pads are shown as pads 202a–202n, 204a–204n, 206a–206n, and 208a–208n. In an embodiment of the present invention, the pads are input/output (I/O) pads. As such, the I/O pads can receive and/or transmit data and/or control signals (e.g., clock signals).

In an embodiment of the present invention, the I/O pads transmit and/or receive data and/or control signals in a parallel format. For example, I/O pads can be communicatively coupled to XGMII parallel ports, where the XGMII transceiver protocol is known to those skilled in the relevant art(s).

In another embodiment of the present invention, I/O pads transmit and/or receive data and/or control signals in a serial format. For example, I/O pads can be communicatively coupled to XAUI serial ports. In an embodiment, the XAUI serial ports operate at data rates of 3.125 GHz, 2.5 GHz, and 1.25 GHz. In other words, fuse corner pad 100 can be coupled to a multi-rate transceiver device.

Referring back to FIG. 2, assume that square die 200 includes two-hundred, fifty-six pads (i.e., pads 202a–202n, 204a–204n, 206a–206n, and 208a–208n), there would be a total of sixty-four pads on each side. If each pad (i.e., pads 202a–202n, 204a–204n, 206a–206n, and 208a–208n) had a 60 μm×200 μm pad dimension, the dimension of each side of square die 200 would be (64×60)+(2×200) or 4,240 μm. It is further assumed that the distance between each pad (i.e., pads 202a–202n, 204a–204n, 206a–206n, and 208a–208n) is negligible. Consequently, the surface area of square die 200 would be 4,240×4,240=17.98 mm².

Figure 3:
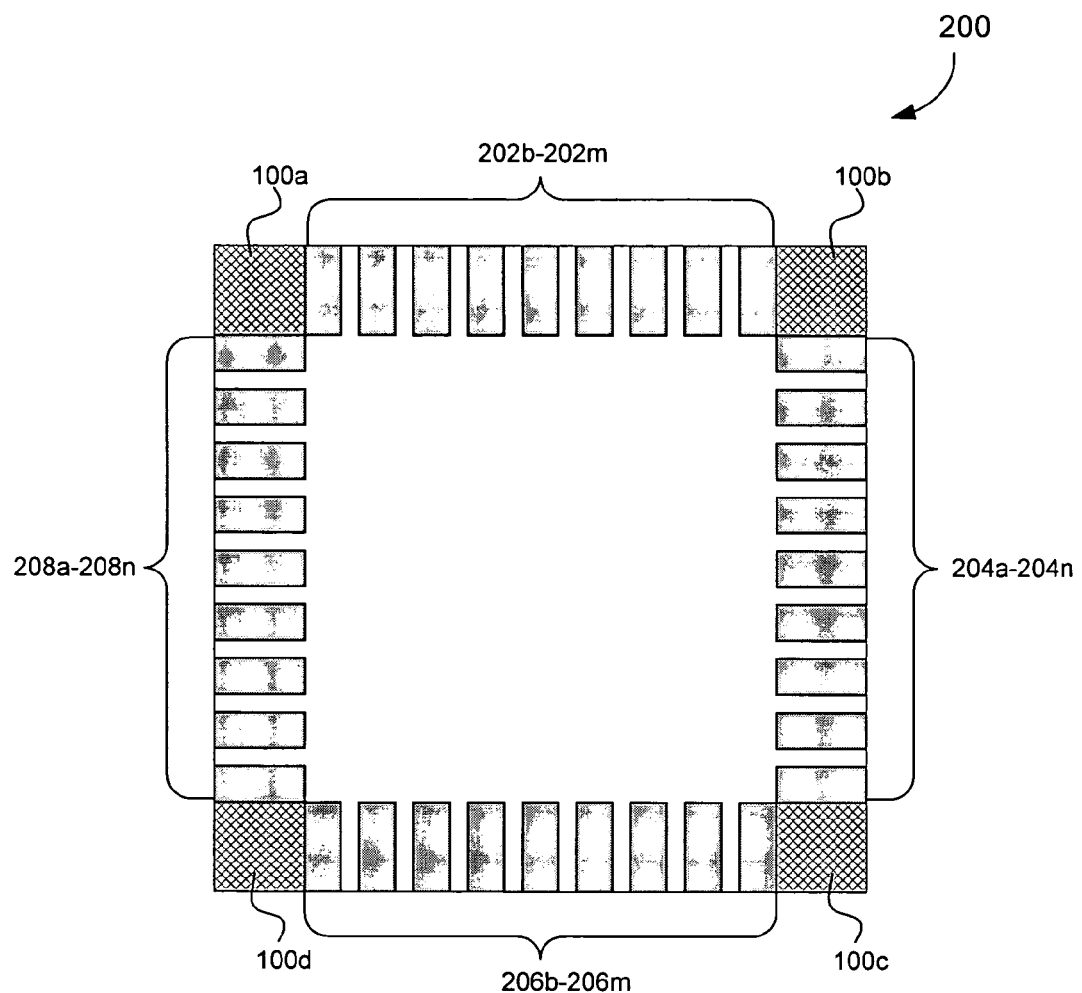
FIG. 3 illustrates a semiconductor die having a plurality of fuse corner pads according to an embodiment of the present invention.

FIG. 3 illustrates four fuse corner pads 100a–100d coupled to square die 200. The fuse corner pads 100a–100d are not bonded to an external electrical connection (e.g., a pin and/or ball connection). However, each fuse corner pad 100a–100d can be probed, as discussed above, without causing any physical damage to the fuse corner pads 100a–100d. Therefore, the fuse corner pads 100a–100d of the present invention can be used in semiconductor packages that have an embedded fuse and that require probing but not bonding.

As shown in FIG. 3, pads 202a, 202n, 206a, and 206n (from FIG. 2) have been removed, so that each of the four fuse corner pads 100a–100d can be located in a respective corner of square die 200. Since pads 202a, 202n, 206a, and 206n have been eliminated, the dimensions of the top and bottom sides are reduced by two pads or 120 μm for each side. The new die area for square die 200 is 4,120×4,240=17.47 mm². This represents a 2.8% reduction from the surface area of the square die 200 discussed above with reference to FIG. 2. As more components are integrated onto square die 200, the amount of surface area reduction would increase. For example, if the number of Ethernet ports on square die 200 increase from eight to twenty-four, the area saving could be increased to 8.5%.

Figure 4:
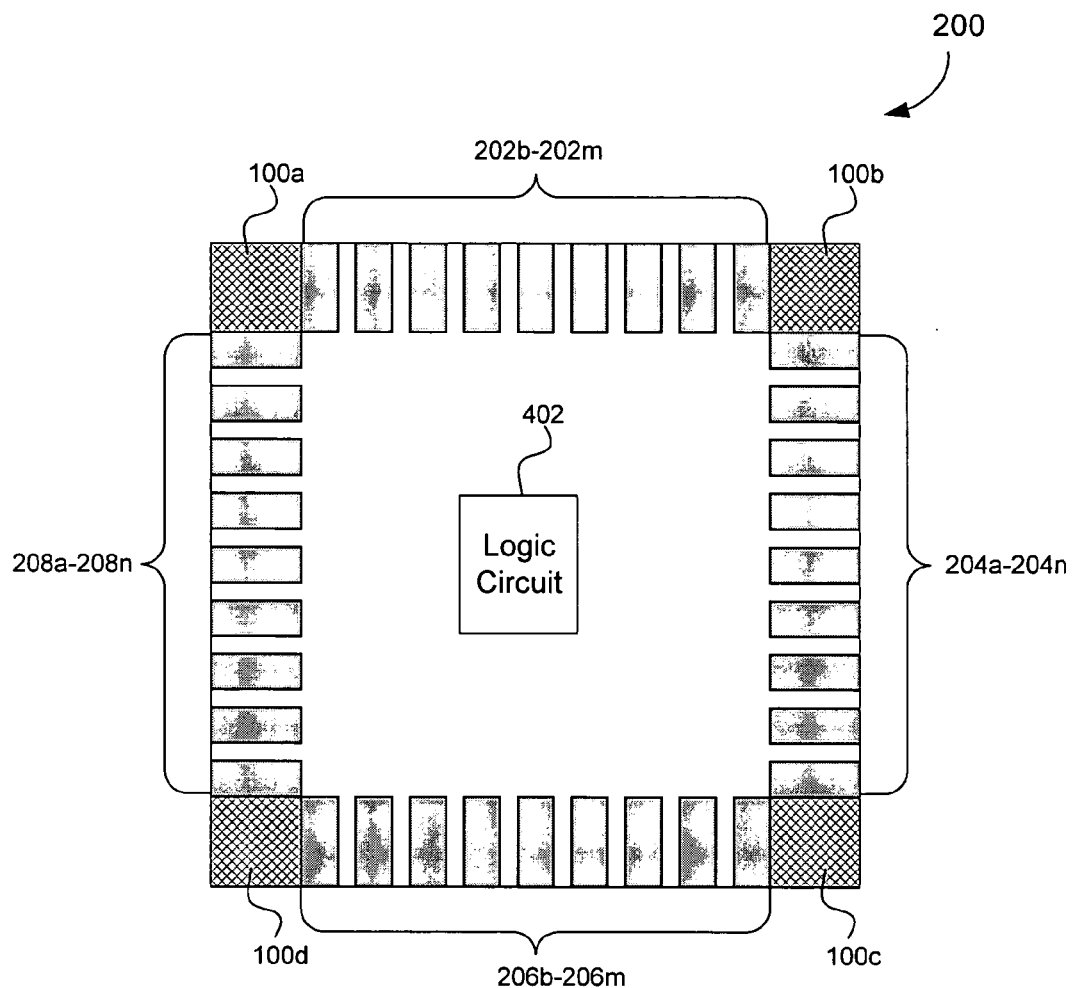
FIG. 4 illustrates a semiconductor die having a plurality of fuse corner pads according to another embodiment of the present invention.

According to the present invention, fuse contact 102 and fuse element 106 can have a plurality of applications. In an embodiment, fuse contact 102 and fuse element 106 are used inside of fuse corner pad 100 for programmability (e.g., for security). For example, fuse contact 102 and fuse element 106 can be used to register, or otherwise identify, a chip (such as, die 200 described with reference to FIG. 3). Fuse element 106 can be blown (e.g., disconnect the current flow) or not blown (e.g., enable the current flow) to create a unique identifier for a chip associated with fuse element 106. In an embodiment, a software application or logic control circuit sends a signal to burn fuse element 106. FIG. 4 illustrates another embodiment of square die 200 that includes a logic control circuit 402 in addition to four fuse corner pads 100a–100d. Logic control circuit 402 can be used to send a signal to burn fuse element 106. This technique can be used to register a chip after the fuse corner pad(s) 100 has been fabricated.

In another embodiment, fuse element 106 is blown by applying a current from a probe, for example, that exceeds a predetermined threshold to melt fuse element 106. This technique can be used during the fabrication of a fuse corner pad 100 or during post-fabrication. In other words, during the fabrication process, fuse contact 102 is not burned before the fuse corner pad(s) 100 is cut and packaged. Afterwards, fuse contact 102 can be probed with a probe card to burn the fuse element 106.

When fuse element 106 and fuse contact 102 are used as a chip identifier, a binary scheme can be used to identify the chip. For example, the value "1" can be used to indicate a non-burned state for fuse element 106, and the value "0" can be used to denote a burned state for fuse element 106. Assume that four fuse elements 106 are associated with a chip. This can be accomplished by providing four fuse corner pads 100 having a single fuse contact 102 in each fuse corner pad 100, four fuse contacts 102 within a single fuse corner pad 100, or a similar combination of fuse corner pads 100 and fuse contacts 102. Nonetheless, if four fuse elements 106 are present in the chip, sixteen combinations of identifiers are available for identifying or registering the chip. As such, when a software application (e.g., logic control circuit 402) reads the chip, the software application can check to see if the fuse element(s) have been blown and therefore detect the chip identifier.

In another embodiment, fuse contact 102 and fuse element 106 are used inside of fuse corner pad 100 for adjustment (e.g., trimming) of an analog and/or a digital circuit that is located in another part of a chip (e.g., square die 200). For example, fuse contact 102 and fuse element 106 are used to adjust a transmitting waveform to meet a specified voltage level. In an embodiment, fuse contact 102 and fuse element 105 can also be used to prevent a conductive path from carrying a current that exceeds a predetermined threshold. Fuse element 106 or a combination of fuse elements 106 can be used to program or calibrate other analog circuit(s) to meet certain specifications without further intervention from an end-user customer.

In accordance with the present invention, fuse contact 102 and/or auxiliary pads 104a–104n enables functional components to be fully integrated within the corner of an integrated circuit, which is a portion of a chip that is conventionally not used. In an embodiment of the present invention, fuse corner pad 100 includes test circuitry (not shown) in addition to fuse element 106. The test circuitry generates and processes a test packet that can be transmitted over any of the serial and/or parallel ports coupled to I/O pads (e.g., pads 202b–202m, 204a–204n, 206b–206m, and 208a–208n). Any type of test packet can be generated to perform the testing and at different data rates.

In an embodiment, the test circuitry can be active circuitry for a ring oscillator for wafer processing testing purposes. In an embodiment, an Iddq test message is released to measure the quiescent supply current across a path within a fuse corner pad 100. In an embodiment, the test circuitry provides a built-in self test for a data link. For example, a test packet can be generated and sent over one or more of the I/O pads (e.g., pads 202b–202m, 204a–204n, 206b–206m, and 208a–208n) to implement bit error rate testing of the data link. Likewise, the test data packet can capture test data received over any one of the I/O pads (e.g., pads 202b–202m, 204a–204n, 206b–206m, and 208a–208n). A bit error rate can then be determined based on this comparison.

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. An integrated circuit, comprising:
a fuse corner pad located at a corner of the integrated circuit, said fuse corner pad having first and second edges that define said corner of said integrated circuit, wherein said fuse corner pad includes a fuse contact integrated with said fuse corner pad.

2. The integrated circuit of claim 1, further comprising:
a fuse element connected to said fuse contact.

3. The integrated circuit of claim 2, wherein said fuse element is adapted to adjust a transmitting waveform to comply with a predefined parameter.

4. The integrated circuit of claim 2, wherein said fuse element is adapted to communicate a state of said fuse element, said state identifying the integrated circuit.

5. The integrated circuit of claim 1, wherein said fuse contact is capable of being probed without being bonded to an external connection.

6. The integrated circuit of claim 1, further comprising:
an auxiliary pad coupled to said fuse corner pad.

7. The integrated circuit of claim 6, wherein said auxiliary pad is a second fuse contact.

8. The integrated circuit of claim 6, wherein said auxiliary pad communicates signals for circuit testing.

9. A semiconductor die, comprising:
at least one I/O pad, on the semiconductor die, for communicating signals; and
a fuse corner pad having a fuse integrated within said fuse corner pad, wherein said fuse corner pad includes first and second edges that define a corner of the semiconductor die.

10. The semiconductor die of claim 9, wherein said fuse corner pad is capable of being probed without being bonded to an external connection.

11. The semiconductor die of claim 9, wherein said fuse corner pad is one of four fuse corner pads, wherein each of said four fuse corner pads is located at a respective corner of the semiconductor die.

12. An integrated circuit, comprising:
a fuse corner pad located at a corner of the integrated circuit, said fuse corner pad having first and second edges that define said corner of the integrated circuit, wherein said fuse corner pad includes a plurality of fuse contacts coupled to said fuse corner pad.

13. The integrated circuit of claim 12, wherein at least one of said plurality of fuse contacts is connected to a fuse element included in the integrated circuit.

* * * * *